(12) United States Patent
Tewinkle

(10) Patent No.: US 7,939,788 B2
(45) Date of Patent: May 10, 2011

(54) MULTI-CHIP PHOTOSENSOR WITH INDEPENDENTLY ADJUSTABLE INTEGRATION TIMES FOR EACH CHIP

(75) Inventor: Scott L Tewinkle, Ontario, NY (US)

(73) Assignee: Xerox Corporation, Norwalk, CT (US)

( * ) Notice: Subject to any disclaimer, the term of this patent is extended or adjusted under 35 U.S.C. 154(b) by 139 days.

(21) Appl. No.: 12/188,240

(22) Filed: Aug. 8, 2008

(65) Prior Publication Data

US 2010/0032549 A1 Feb. 11, 2010

(51) Int. Cl.
*H01L 27/00* (2006.01)
*H03K 17/78* (2006.01)
*H01J 40/14* (2006.01)
*H04N 3/14* (2006.01)
*H04N 1/04* (2006.01)

(52) U.S. Cl. .......... 250/208.1; 250/214 SW; 250/214 R; 348/297; 358/482

(58) Field of Classification Search ........... 250/214 SW, 250/214 LS, 214 R, 214 A, 208.1, 214.1, 250/234, 578.1, 214 LA, 214 C, 214 AL, 250/214 AG, 214 B; 356/71; 382/112; 348/294, 348/295, 297, 300, 301, 308, 309, 304, 312, 348/241, 302, 298; 257/140, 208–211, 443–444, 292; 358/482, 483
See application file for complete search history.

(56) References Cited

U.S. PATENT DOCUMENTS

| | | | |
|---|---|---|---|
| 4,262,301 A * | 4/1981 | Erlichman | 386/31 |
| 4,335,405 A * | 6/1982 | Sakane et al. | 348/297 |
| 5,148,168 A | 9/1992 | Masuda et al. | |
| 5,519,514 A | 5/1996 | TeWinkle | |
| 6,014,160 A | 1/2000 | TeWinkle et al. | |
| 6,819,781 B1 * | 11/2004 | Simpkins | 382/112 |
| 2006/0274174 A1 | 12/2006 | TeWinkle | |

* cited by examiner

*Primary Examiner* — Georgia Y Epps
*Assistant Examiner* — Don Williams
(74) *Attorney, Agent, or Firm* — Simpson & Simpson, PLLC

(57) ABSTRACT

A photosensitive apparatus, such as a scanner used in a digital copier, includes a plurality of photosensor chips. Each photosensor chip comprises a first set of photosensors, and a control portion for accepting an external integration signal, the signal causing an integration time for the set of photosensors. A signal adjustor is associated with the control portion, and effectively alters the external integration signal to cause the control portion to cause a modified integration time for the first set of photosensors. The system enables adjustments of integration times among chips within an apparatus sharing a common control line.

11 Claims, 4 Drawing Sheets

US 7,939,788 B2

MULTI-CHIP PHOTOSENSOR WITH INDEPENDENTLY ADJUSTABLE INTEGRATION TIMES FOR EACH CHIP

INCORPORATION BY REFERENCE

The following U.S. Patents are hereby incorporated by reference, in their entireties, for the teachings therein: U.S. Pat. Nos. 5,519,514 and 6,014,160; and Published Application 20060274174.

TECHNICAL FIELD

The present invention relates to image sensor arrays used in input scanners, such as in digital copiers or facsimile machines, or in digital cameras.

BACKGROUND

Image sensor arrays typically comprise a linear array of photosensors which raster scan an image bearing document and convert the microscopic image areas viewed by each photosensor to image signal charges. Following an integration period, the image signal charges are amplified and transferred as an analog video signal to a common output line or bus through successively actuated multiplexing transistors.

For high-performance image sensor arrays, one possible design includes an array of photosensors of a width comparable to the width of a page being scanned, to permit one-to-one imaging generally without the use of reductive optics. In order to provide such a "full-width" array, however, relatively large silicon structures must be used to define the large number of photosensors. One technique to create such a large array is to make the array out of several butted silicon chips. In one proposed design, an array is intended to be made of 20 silicon chips, butted end-to-end, each chip having active photosensors spaced at 400 or more photosensors per inch.

Further, in a full-color scanner, as would be used in color copying, there may be provided three or more linear arrays on each chip, each array filtered to receive a single primary color. As described in U.S. Pat. No. 5,519,514, each linear array on a chip may be desired to be independently controllable in some respects, particularly in terms of "integration time." Integration time is, broadly speaking, the length a particular photosensor is exposed to light from a small area on the original image being scanned, to yield a pixel of data. In the case of a color apparatus, each of three or more primary-color photosensors will view the substantially same small area in the original image, to yield full-color image data. In various situations, the integration times associated with different-color linear arrays on a single chip may be desired to be finely adjusted.

The present disclosure addresses a system for adjusting integration times associated with different photosensor sets in different chips within a larger system.

SUMMARY

According to one aspect, there is provided a photosensor chip comprising a first set of photosensors, and a control portion for accepting an external integration signal, the signal causing an integration time for the set of photosensors. A signal adjustor, associated with the control portion, effectively alters the external integration signal to cause the control portion to cause a modified integration time for the first set of photosensors.

According to another aspect, there is provided a photosensitive apparatus, such as scanner used in a digital copier, includes a plurality of photosensor chips. Each photosensor chip comprises a first set of photosensors, and a control portion for accepting an external integration signal, the signal causing an integration time for the set of photosensors. A signal adjustor associated with the control portion effectively alters the external integration signal to cause the control portion to cause a modified integration time for the first set of photosensors. A common line applies an external integration signal to each of the plurality of photosensor chips.

DETAILED DESCRIPTION

Figure 1:
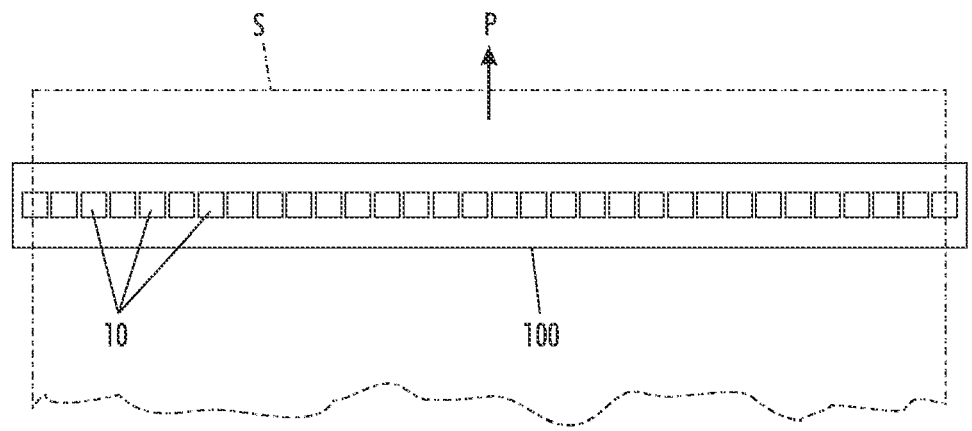
FIG. 1 is a plan view of a portion of a "full-width-array" input scanner as would be used in office equipment such as a digital copier, as known in the prior art.

FIG. 1 is a plan view of a portion of a "full-width-array" input scanner as would be used in office equipment such as a digital copier. A set of photosensor chips, each indicated as 10, is arranged on a circuit board 100. Each chip 10 includes a set of photosensors, as will be described below. Together, the chips 10 on board 100 form one or more linear arrays of photosensors that extend a length comparable to the width of an image-bearing sheet such as S effectively moving in a process direction P. The sheet S can move relative to the board 100 by being placed on a platen (not shown) relative to which the board 100 moves; or the sheet S can be fed through a document handler (not shown). As the sheet S moves past board 100, a series of small areas on the sheet S reflect light (from a source, not shown) into photosensors on the chips 10. The chips 10 receive the reflected light from sheet S and output image signals for subsequent recording and processing.

Figure 2:
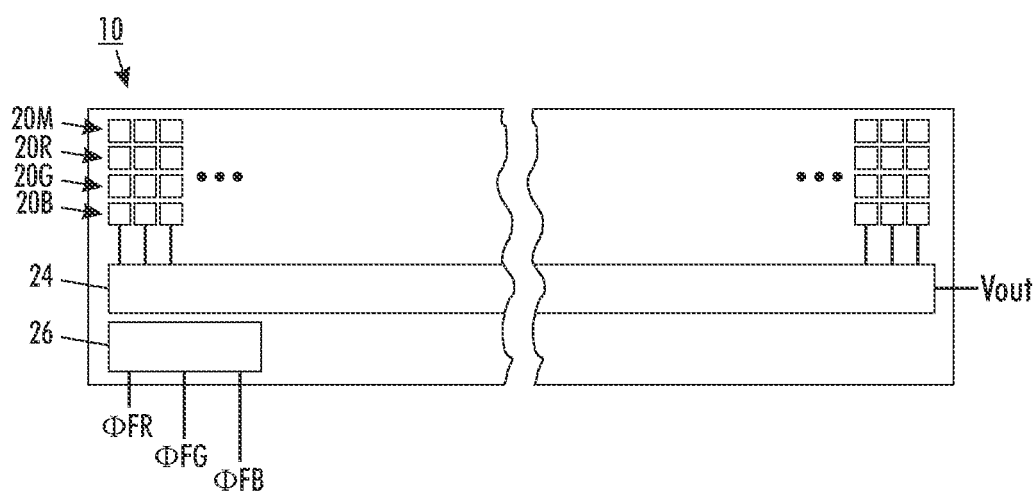
FIG. 2 shows a photosensor chip 10 in isolation, as known in the prior art.

FIG. 2 shows a photosensor chip 10 in isolation. In this embodiment, each chip 10 includes four linear arrays, or rows, of photosensors, labeled 20M (for monochrome), 20R (for red), 20G (for green) and 20B (for blue). Each array is provided with a translucent filter (not shown) that causes the array to be sensitive to a particular color or range of wavelength. The monochrome array 20M is sensitive to light throughout the visible spectrum, and is useful when scanning images for monochrome-only image data, as would be useful, for example, in a monochrome copier or facsimile machine, or for optical character scanning. The photosensors may also be provided with other types of filters, such as for infrared blocking.

In the present embodiment, for each "column" (as shown in the Figure) of one photosensor of each type 20M, 20R, 20G, 20B, there is one output line to an output shift register 24. A general description of how multiple photosensors in a column send signals over one line to a shift register is given in U.S. Pat. No. 5,148,168 mentioned above. It will be evident that each photosensor of each type 20M. 20R, 20G, 20B in a column will "look at" one small area of an image being recorded, to obtain full color image data about the small area. A description of how the action of multiple photosensors of different colors must be coordinated is given in U.S. Pat. No. 5,519,514, mentioned above. Once a "scanline" of digital image signals is loaded into shift register 24, the image data for that scanline is output from the chip 10, such as through line $V_{OUT}$.

As mentioned above, a key control for a chip 10 is the start and stop times defining an "integration time" of each photosensor. An integration time is the length of time a particular photosensor receives light from a given small area, typically as the sheet moves a series of small areas past each photosensor. In a multi-chip system, it may be desirable to make small adjustments in the integration time of a set of photosensors on the chip, such as to overcome manufacturing anomalies between chips within the same apparatus. As shown in the prior-art basic case in FIG. 2, different lines for controlling the integration time of different subsets of photosensors, φFR, φFG, φFB (for red, green and blue rows of photosensors respectively) can feed into a control portion 26 governing the chip 10.

Figure 3:
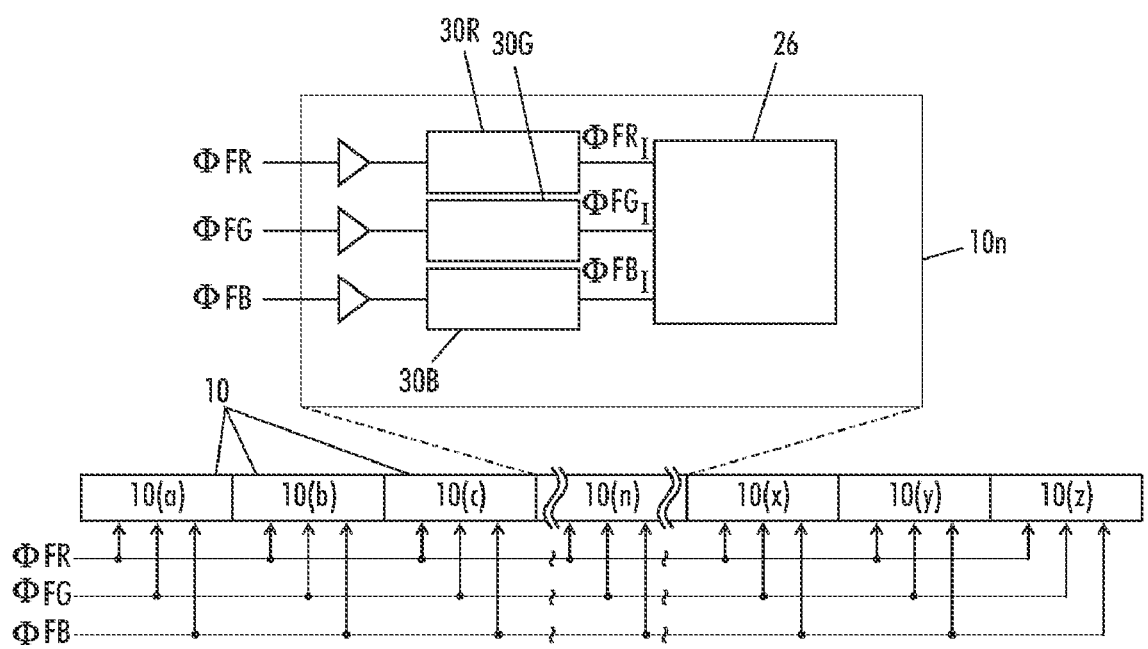
FIG. 3 is a simplified diagram illustrating a principle of the present embodiment.

FIG. 3 is a simplified diagram illustrating a principle of the present embodiment. As with the previous Figures, a butted array of photosensor chips 10 is provided, each chip 10a-z being connected through a common line to an external control system (not shown). In the present case, each chip 10a-z has at least three sets of photosensors thereon, typically a red-filtered, green-filtered, and a blue-filtered set. Each set of photosensors on each chip, in turn, is controlled, in terms of its integration time, by one external line, here marked φFR, φFG, φFB. In a basic case, a going-high signal on φFR would cause all red photosensors on all chips to start an integration time, and going low would cause all red photosensors on all chips to end the integration time; the same principle applies to the green and blue photosensors with the φFG and φFB. In this basic case, because all photosensors of each color on each chip are controlled through a common line for their integrations times, there is no provision for chip-to-chip adjustments in integration times, should that be desired to overcome manufacturing anomalies between chips.

FIG. 3 further shows in detail a representative chip 10n. At the input lies for each external input φFR, φFG, φFB, there is provided what can be called a "signal adjustor," one for each color line, marked 30R, 30G, 30B. The function of each signal adjustor is to effectively alter the incoming integration signal to cause a modified integration time for the set of photosensors. In an embodiment, each signal adjustor such as 30R accepts the common input going simultaneously to all chips in the scanner; but, for the particular chip such as 10n, outputs an altered signal which will have the effect of altering the integration time for the red photosensors in some way. The altered signal is then fed into the control portion 26, which uses the signal to control the integration time of the red photosensors in the same manner as in the basic prior-art case of FIG. 2.

One possible way the signal adjustor such as 30R can alter the incoming signal φFR is to add or subtract from the duration of the signal (between going-high and going-low), by some predetermined amount. The adjustment to the length of the incoming signal (to yield the modified signal shown as φFR$_f$) will correspond to a change in the integration time for the red photosensors when the modified signal is applied to the control portion 26. Other ways of adjusting the incoming signal could include multiplying the duration of the signal by an adjustment constant (which may be more or less than 1.0); adjusting the amplitude of the signal for whatever reason; or generating a new signal of predetermined duration in response to receiving a change in state of the incoming signal. (The present discussion, of course, applies to the φFG and φFB signals as well, and the different sets of photosensors, controlled by different input signals, can operate substantially independently within a chip such as 10n.)

Figure 4:
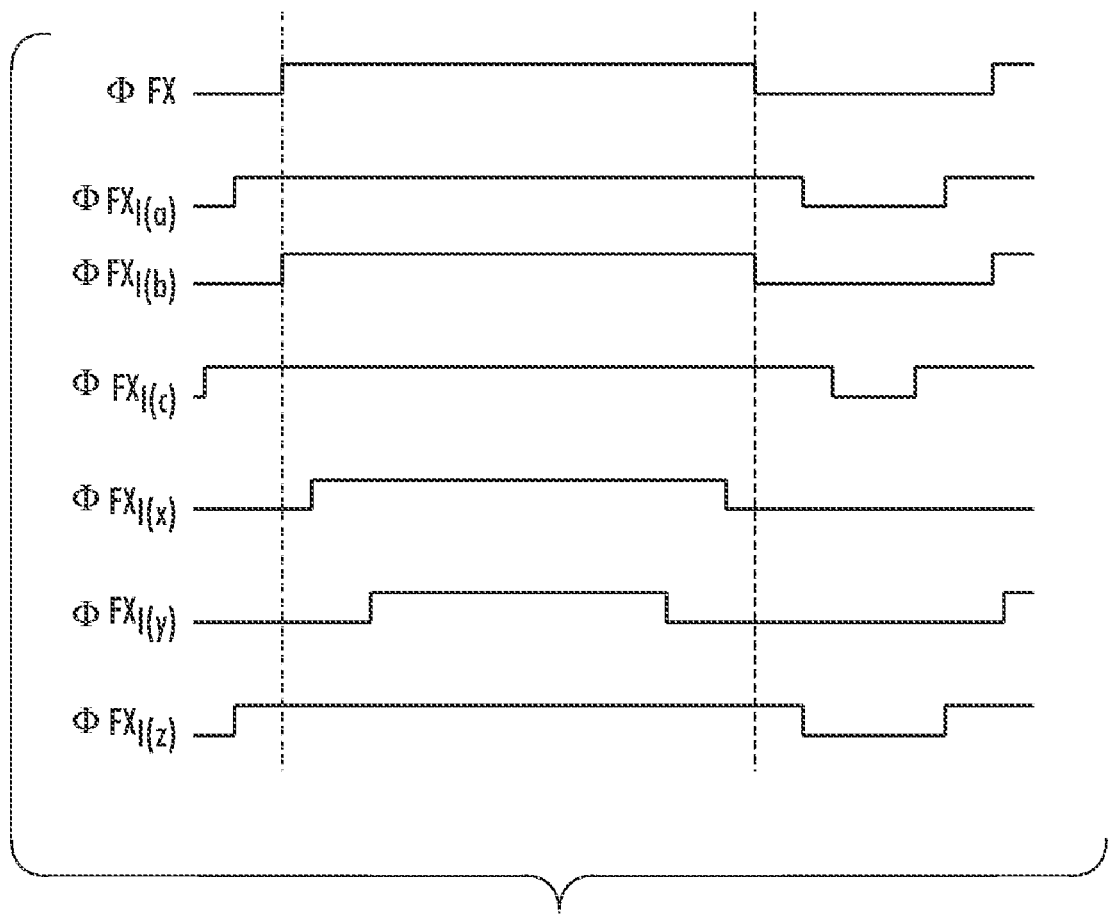
FIG. 4 and FIG. 5 are timing diagrams showing the operation of a signal adjustor among each of a set of chips, according to different embodiments.
Figure 5:
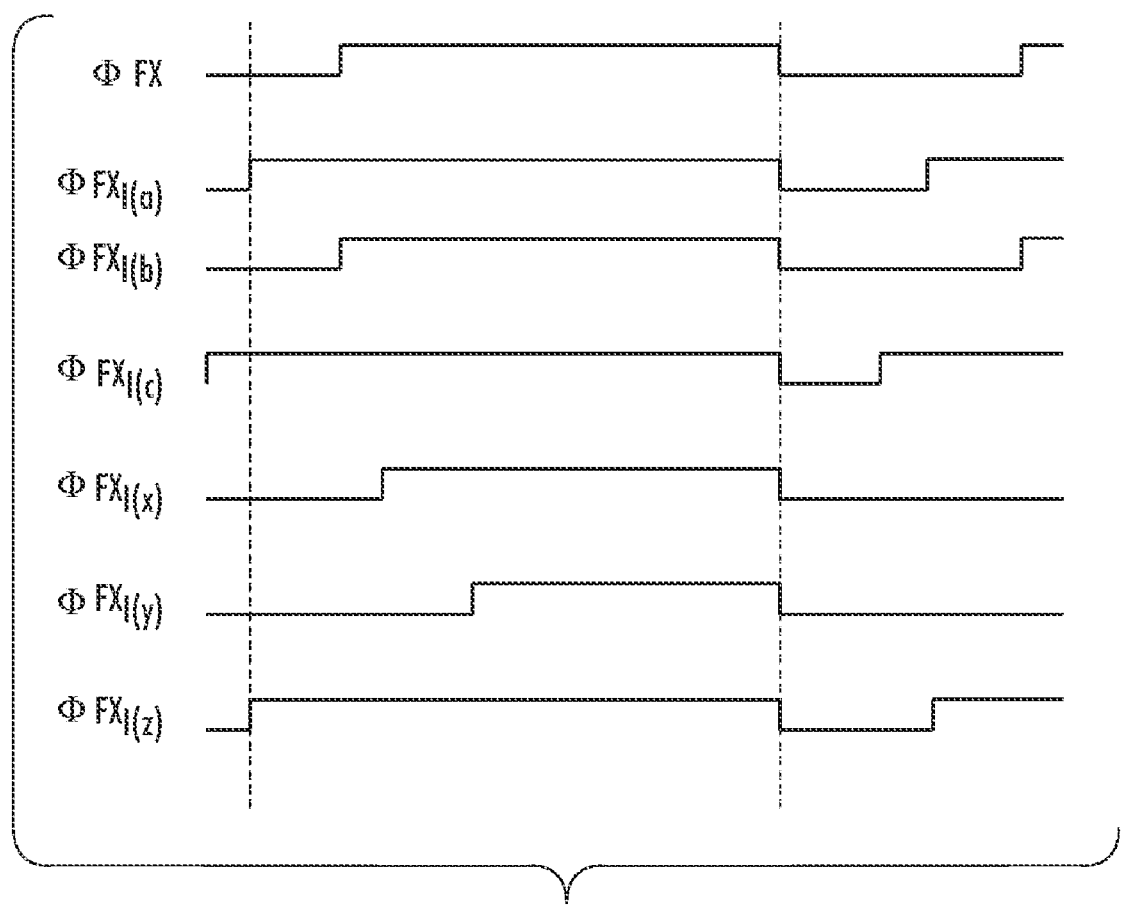

FIG. 4 and FIG. 5 are timing diagrams showing the operation of a signal adjustor such as 30R, among each of a set of chips 10a-z, according to different embodiments. In the FIG. 4 embodiment, a generalized input signal φFX is modified in various ways by the signal adjustor of different chips, as indicated by φFX$_f$(a-z). As can be seen, various of the modified signals φFX$_f$(a-z) are shorter or longer in duration, as required, compared to the input signal φFX; further, as can be seen, each modified signal φFX$_f$(a-z) is "centered" in time relative to the input signal; i.e., a mandated longer signal starts before and ends after the duration of the input signal, and a mandated shorter signal starts after and ends before the duration of the input signal, so that the midpoints of the input signal and all the modified signals are simultaneous. In an implementation of the FIG. 4 embodiment, the system "knows" when to start longer integration time signals (that would otherwise begin before the input signal), by learning the characteristics of an external clock with some counters and then making adjustments to the counters. Another approach would be to determine maximum integration time required for the sensor with the lowest response and then to adjust all of the others relative to this one so they will all be shorter.

In the FIG. 5 embodiment, the system is designed so that the end points of all the modified signals are simultaneous with the endpoint of the input signal. The FIG. 5 arrangement may be useful when coordinating the integration times with readout circuitry (not shown), particularly in chip designs where video is output in response to a falling edge of an input signal.

In one possible scenario, for a given chip 10, following manufacture and perhaps following installation into a larger, multi-chip apparatus, the signal output from a particular set of photosensors on the chip is measured; and then a correction datum (such as an 8-bit word) is loaded into the corresponding controlling signal adjustor such as 30R, 30B, 30G, to cause subsequent outputs from the signal adjustor to change the integration time of the set of photosensors to be consistent with a standard. In a practical implementation, loading of this correction datum is required only at manufacture of an apparatus such as a scanner, but in some scenarios, changing the correction datum to each signal adjustor on each chip in an apparatus over the course of use may be desirable.

The above-described system, in which each set of photosensors on each chip can be controlled by a modified signal within the chip, enables each set of photosensors on each chip in a larger system to be finely adjusted in terms of integration time. In a practical implementation, this adjustment of the integration times can be used to overcome manufacturing anomalies among chips (and photosensor sets within a chip), so that the amplitude of a video signal from all the sets of photosensors on all chips in an apparatus will be consistent.

In contrast with the present disclosure, a system of simply adjusting gain would not change the signal-to-noise ratio because any noise would also be adjusted equally; and adjusting gain also adjusts offset, which is not desirable. Changing the integration time, as in the present disclosure, is effectively the same as adjusting the light level on the photosensors, and thus will not have an adverse effect on signal-to-noise ratio. In addition, adjusting integration time to equalize signals, as in the present disclosure, requires less of the signal range to be allocated to correction, which further enables a higher signal-to-noise ratio.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

What is claimed is:

1. A photosensor chip, comprising:
a first set of photosensors;
a control portion for accepting an external integration signal, the signal causing an integration time for the set of photosensors;
a signal adjustor associated with the control portion, the signal adjustor effectively altering the external integration signal to cause the control portion to cause a modified integration time for the first set of photosensors.

2. The chip of claim 1, wherein the signal adjustor effectively causes the modified integration signal to be different from the external integration signal by a predetermined duration.

3. The chip of claim 1, wherein the signal adjustor effectively causes the modified integration signal to be different from the external integration signal by a predetermined proportion.

4. The chip of claim 1, wherein, following manufacture of the photosensor chip, the signal adjustor accepts a datum instructing the signal adjustor to modify the external integration signal in a predetermined manner.

5. The chip of claim 4, wherein, following manufacture of the photosensor chip, the signal adjustor accepts a datum instructing the signal adjustor to cause a modified integration signal to be different from the external integration signal by a predetermined duration, the predetermined duration being related to the datum.

6. The chip of claim 1, further comprising
a second set of photosensors;
the control portion accepting a second external integration signal, the second external integration signal causing an integration time for the second set of photosensors; and
a second signal adjustor associated with the control portion, the second signal adjustor effectively altering the second external integration signal to cause the control portion to cause a modified integration time for the second set of photosensors.

7. The chip of claim 6, wherein the first set of photosensors is sensitive to a first color and the second set of photosensors is sensitive to a second color.

8. A photosensitive apparatus comprising:
a plurality of photosensor chips, each chip including
a first set of photosensors,
a control portion for accepting an external integration signal, the signal causing an integration time for the set of photosensors, and
a signal adjustor associated with the control portion, the signal adjustor effectively altering the external integration signal to cause the control portion to cause a modified integration time for the first set of photosensors; and
a first common line for applying a first external integration signal to each of the plurality of photosensor chips.

9. The photosensitive apparatus of claim 8, further comprising a second common line for applying a second external integration signal to each of the plurality of photosensor chips, and each chip further including
a second set of photosensors,
the control portion of each chip accepting the second external integration signal, the second external integration signal causing an integration time for the second set of photosensors; and
a second signal adjustor associated with the control portion, the second signal adjustor effectively altering the second external integration signal to cause the control portion to cause a modified integration time for the second set of photosensors.

10. The apparatus of claim 9, wherein, for each chip, the first set of photosensors is sensitive to a first color and the second set of photosensors is sensitive to a second color.

11. A photosensor chip, comprising:
a first set of photosensors;
a control portion for accepting an external integration signal, the signal causing an integration time for the set of photosensors;
a signal adjustor associated with the control portion, the signal adjustor effectively altering the external integration signal to cause the control portion to cause a modified integration time for the first set of photosensors, wherein the integration time is a length of time a particular photosensor receives light.

\* \* \* \* \*